(12) United States Patent
Sunshine et al.

(10) Patent No.: US 12,232,270 B2
(45) Date of Patent: Feb. 18, 2025

(54) FABRIC WITH EMBEDDED ELECTRICAL COMPONENTS

(71) Applicant: Apple Inc., Cupertino, CA (US)

(72) Inventors: Daniel D. Sunshine, Austin, TX (US); Daniel A. Podhajny, Morgan Hill, CA (US); Kathryn P. Crews, Menlo Park, CA (US); Yohji Hamada, Wakayama (JP)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/188,273

(22) Filed: Mar. 22, 2023

(65) Prior Publication Data
US 2023/0225056 A1    Jul. 13, 2023

Related U.S. Application Data

(63) Continuation of application No. 16/926,565, filed on Jul. 10, 2020, now Pat. No. 11,617,268, which is a
(Continued)

(51) Int. Cl.
*H05K 1/18* (2006.01)
*D03D 1/00* (2006.01)
(Continued)

(52) U.S. Cl.
CPC ........... *H05K 1/189* (2013.01); *D03D 1/0088* (2013.01); *D03D 15/533* (2021.01); *D03J 1/00* (2013.01);
(Continued)

(58) Field of Classification Search
None
See application file for complete search history.

(56) References Cited

U.S. PATENT DOCUMENTS 6,493,933 B1 * 12/2002 Post .................. H01L 23/49861
29/846
8,093,617 B2    1/2012 Vicard et al.
(Continued)

FOREIGN PATENT DOCUMENTS

CN        1650057 A    8/2005
CN        1751148 A    3/2006
(Continued)

OTHER PUBLICATIONS

Dorfel, "Development of Solutions for Inserting Inserts on Ribbon Loom and Wide-Weaving Machines for Smart Fabrics and Automobile Fabrics", Institute for Textile Machinery and Textiles High Performance Materials Technology at TU [Technical University] Dresden (ITM), Jan. 13, 2011.

*Primary Examiner* — Shawn Mckinnon
(74) *Attorney, Agent, or Firm* — Treyz Law Group, P.C.; G. Victor Treyz; Kendall P. Woodruff

(57) ABSTRACT

Electrical components may have plastic packages. Contacts may be formed on exterior surfaces of the plastic packages. A plastic package for an electrical component may have an elongated shape that extends along a longitudinal axis. A first groove may run parallel to the longitudinal axis on a lower surface of the plastic package. A second groove may run perpendicular to the first groove on an opposing upper surface of the plastic package. The electrical components may be coupled to fibers in a fabric such as a woven fabric. A first solder connection may be formed between the first groove and a first fiber such as a weft fiber. A second solder connection may be formed between the second groove and a second fiber such as a warp fiber.

17 Claims, 21 Drawing Sheets

Related U.S. Application Data continuation of application No. 15/514,440, filed as application No. PCT/US2015/050434 on Sep. 16, 2015, now Pat. No. 10,772,209.

(60) Provisional application No. 62/057,368, filed on Sep. 30, 2014.

(51) Int. Cl.
| | |
|---|---|
| *D03D 15/533* | (2021.01) |
| *D03J 1/00* | (2006.01) |
| *H01L 23/13* | (2006.01) |
| *H01L 23/31* | (2006.01) |
| *H01L 23/498* | (2006.01) |
| *H01L 25/075* | (2006.01) |
| *H05K 1/03* | (2006.01) |
| *H05K 3/34* | (2006.01) |

(52) U.S. Cl.
CPC .......... *H01L 23/13* (2013.01); *H01L 23/3121* (2013.01); *H01L 23/49805* (2013.01); *H05K 1/038* (2013.01); *H05K 3/34* (2013.01); *D10B 2401/16* (2013.01); *D10B 2401/18* (2013.01); *H01L 25/0753* (2013.01); *H05K 2201/10015* (2013.01); *H05K 2201/10022* (2013.01); *H05K 2201/1003* (2013.01); *H05K 2201/10053* (2013.01); *H05K 2201/10106* (2013.01); *H05K 2201/10151* (2013.01); *H05K 2201/10636* (2013.01)

(56) References Cited

U.S. PATENT DOCUMENTS

| | | | |
|---|---|---|---|
| 2003/0211797 | A1 | 11/2003 | Hill et al. |
| 2008/0255468 | A1* | 10/2008 | Derchak .............. A61B 5/6805 600/529 |
| 2009/0200066 | A1* | 8/2009 | Vicard ............. G06K 19/07749 174/255 |
| 2009/0211620 | A1 | 8/2009 | Dibachi et al. |
| 2012/0073859 | A1* | 3/2012 | Lo ........................ H01L 24/745 205/159 |
| 2012/0118427 | A1* | 5/2012 | Brookstein .......... D03D 1/0088 139/420 A |
| 2013/0033879 | A1 | 2/2013 | Vicard et al. |
| 2013/0087369 | A1 | 4/2013 | Kim et al. |

FOREIGN PATENT DOCUMENTS

| | | |
|---|---|---|
| CN | 101384186 A | 3/2009 |
| CN | 101523605 A | 9/2009 |
| CN | 102017814 A | 4/2011 |
| CN | 102245827 A | 11/2011 |
| CN | 102511203 A | 6/2012 |
| CN | 102822401 A | 12/2012 |
| CN | 103026498 A | 4/2013 |
| CN | 107002318 A | 8/2017 |
| DE | 10305162 A1 | 9/2003 |
| EP | 2020831 A1 | 2/2009 |
| EP | 2610919 A1 | 7/2013 |
| KR | 20050046656 A | 5/2005 |

\* cited by examiner

FABRIC WITH EMBEDDED ELECTRICAL COMPONENTS

This application is a continuation of patent application Ser. No. 16/926,565, filed Jul. 10, 2020, which is a continuation of patent application Ser. No. 15/514,440, filed Mar. 24, 2017, now U.S. Pat. No. 10,772,209, which is a national stage application, filed under 35 U.S.C. § 371, of international patent application No. PCT/US2015/050434, filed Sep. 16, 2015, which claims the benefit of provisional patent application No. 62/057,368, filed Sep. 30, 2014, all of which are incorporated by reference herein in their entireties.

BACKGROUND

This relates generally to electronic devices, and, more particularly, to electronic devices having electrical components mounted to fabric.

Fabric can be provided with metal wires and other conductive fibers. These fibers can be used to carry signals for electrical components. An electronic device can be formed from a fabric that contains electrical components.

Challenges may arise when mounting electrical components to fabric. If care is not taken, stresses on the fabric will tend to dislodge the electrical components. Short circuits can develop if signal paths are not properly isolated. Overly prominent mounting arrangements may be unsightly.

It would be desirable to be able to address these concerns by providing improved techniques for mounting electrical components to fabric for an electronic device.

SUMMARY

An electronic device may include fabric formed from intertwined fibers. Electrical components may be mounted to the fibers. The fibers may include conductive fibers that convey signals between the electrical components and control circuitry in the electronic device.

Component contacts may be formed on a package for a component. Each component may be coupled to fibers in the fabric using electrical connections. The fabric may be a woven fabric having warp and weft fibers or other suitable fabric.

A first electrical connection may be formed between a first contact and a first fiber. A second electrical connection may be formed between a second contact and a second fiber. Optional additional connections may also be made with one or more other fibers. The connections may be formed using different types of connection materials and/or different types of connection structures.

Fabric configurations may also be used in which fibers in the fabric overlap the component to help hold the component in place.

DETAILED DESCRIPTION

Figure 1:
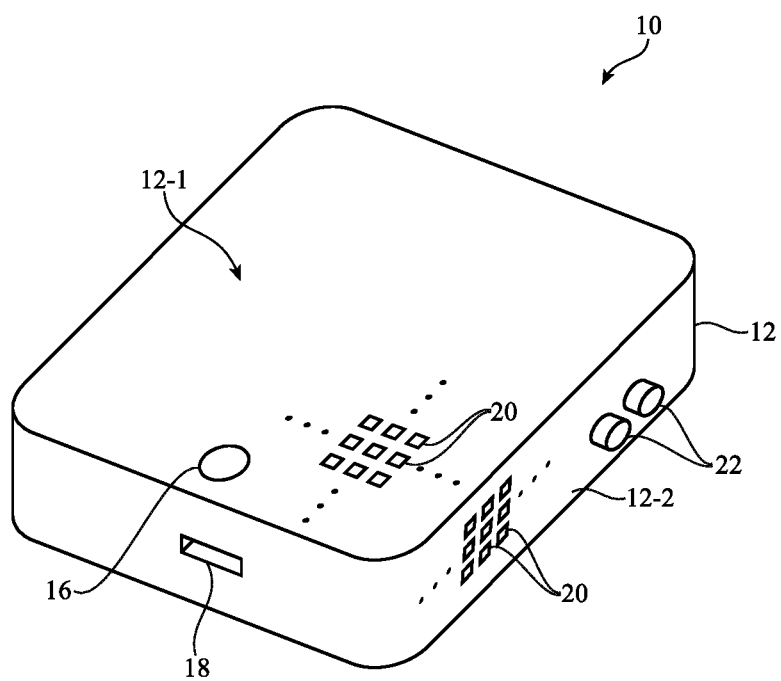
FIG. 1 is a perspective view of an illustrative electronic device in accordance with an embodiment.

An electronic device such as electronic device 10 of FIG. 1 may contain fabric. One or more electrical components may be mounted to the fabric. The electrical components may include audio components, sensors, light-emitting diodes and other light-based components, buttons, connectors, batteries, microelectromechanical systems devices, integrated circuits, packaged components, discrete components such as inductors, resistors, and capacitors, switches, and other electrical components. Device 10 may include control circuitry and a power source such as a battery for providing electrical signals to the electrical components.

The electronic device that contains the fabric may be an accessory for a cellular telephone, tablet computer, wristwatch device, laptop computer, or other electronic equipment. For example, the electronic device may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating, may be part of an item of clothing, or may be any other suitable fabric-based item. If desired, the fabric may be used in forming part of an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based equipment is mounted in a kiosk, in an automobile or other vehicle, equipment that implements the functionality of two or more of these devices, or other electronic equipment.

The fabric to which the electrical components have been mounted may form all or part of an electronic device, may form all or part of a housing wall for an electronic device, may form internal structures in an electronic device, or may form other fabric-based structures. The fabric-based device may be soft (e.g., the device may have a fabric surface that yields to a light touch), may have a rigid feel (e.g., the surface of the device may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

In the illustrative configuration of FIG. 1, device 10 has portions that may be formed from fabric such as upper face 12-1 and sidewalls 12-2. Electrical components 20 have been mounted to fibers within the fabric. Openings in the fabric may, if desired, be used to accommodate components such as buttons 22, button 16, and connector 18 or components such as components 16, 18, and 22 may be omitted. If desired, an opening may be formed in the fabric to receive mating equipment or other items (e.g., when device 10 is being used as a case). Electrical components 20 may be mounted to the fabric of device 10 in regular arrays having rows and columns, may be mounted in a pseudo-random pattern, may be mounted in linear arrays, or may be incorporated into the fabric of device 10 using other suitable patterns. In the example of FIG. 1, components 20 cover the upper surface of device 10 and the edges of device 10. Components 20 may also cover the lower surface of device 10, may cover only a portion of some or all of the surfaces of device 10, or may be formed on part or all of a single side of device 10. The illustrative layout of components 20 of FIG. 1 and the illustrative shape of device 10 of FIG. 1 are merely provided as examples.

Figure 2:
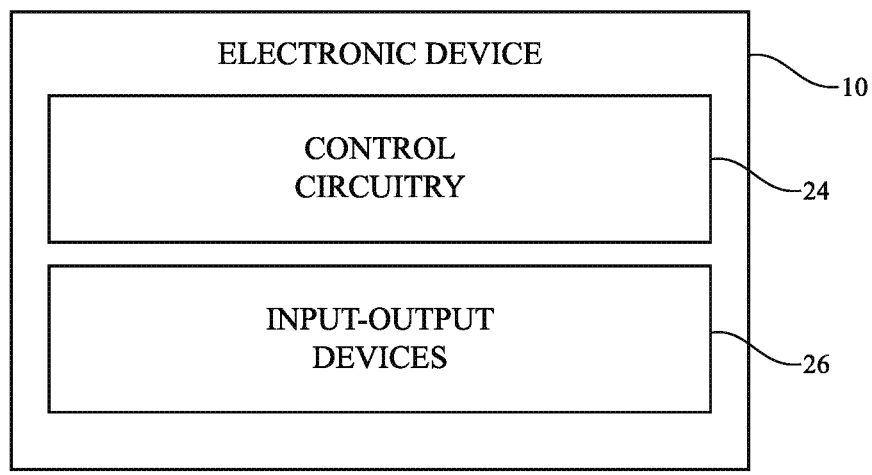
FIG. 2 is a schematic diagram of an illustrative electronic device in accordance with an embodiment.

A schematic diagram of an illustrative electronic device that may include fabric to which one or more components 20 have been mounted is shown in FIG. 2. As shown in FIG. 2, device 10 may include input-output devices 26. Devices 26 may include components 20. Control circuitry 24 may use conductive fibers in the fabric and/or other conductive signal paths to provide electrical signals to devices 26 and components 20 during operation. Components 20 may be used to form touch sensor arrays, acoustic sensor arrays, arrays of other sensors, audio component arrays, connector arrays, displays, status indicators, logos, decorative patterns, or other fabric-based structures that are controlled by control circuitry 24 and/or are powered by a battery or other power source for device 10.

If desired, control circuitry 24 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 24 may be used to control the operation of device 10. The processing circuitry may be based on one or more microprocessors, microcontrollers, digital signal processors, baseband processors and other wireless communications circuits, system-on-chip processors, power management units, audio chips, application specific integrated circuits, etc.

Input-output circuitry in device 10 such as input-output devices 26 (e.g., components 20 and/or other components) may be used to allow data to be supplied to device 10 and to allow data to be provided from device 10 to external devices. Input-output devices 26 may include buttons, joysticks, scrolling wheels, touch pads, key pads, keyboards, microphones, speakers, tone generators, vibrators, cameras, sensors such as touch sensors, capacitive proximity sensors, light-based proximity sensors, ambient light sensors, compasses, gyroscopes, accelerometers, moisture sensors, light-emitting diodes and other visual status indicators, data ports, connectors, switches, audio components, integrated circuits, etc. A user can control the operation of device 10 by supplying commands through input-output devices 26 and/or may receive status information and other output from device 10 using the output resources of input-output devices 26. Components 20 that have been mounted to fabric in device 10 may be used to gather input and/or provide output and/or other components 26 may be used to gather input and/or provide output.

Control circuitry 24 may be used to run software on device 10 such as operating system code and applications. During operation of device 10, the software running on control circuitry 24 may display images for a user on one or more displays and may use other devices within input-output devices 26. For example, the software running on control circuitry 24 may be used to process input from a user using one or more sensors (e.g., capacitive touch sensors, mechanical sensors, thermal sensors, force sensors, switches, buttons, touch screen displays, and other components) and may be used to provide status indicator output and other visual and/or audio output. Control circuitry 24 may also use devices 26 to provide vibrations and other physical output (e.g., haptic output). Devices 26 may, for example, include solenoids, vibrators, or other components that provide physical feedback (e.g., vibrations) to a user in conjunction with a button press, touch input, or other user activity. Changes in fabric attributes such as fabric temperature, texture, size, and shape may also be produced using devices 26 to convey output to a user.

Figure 3:
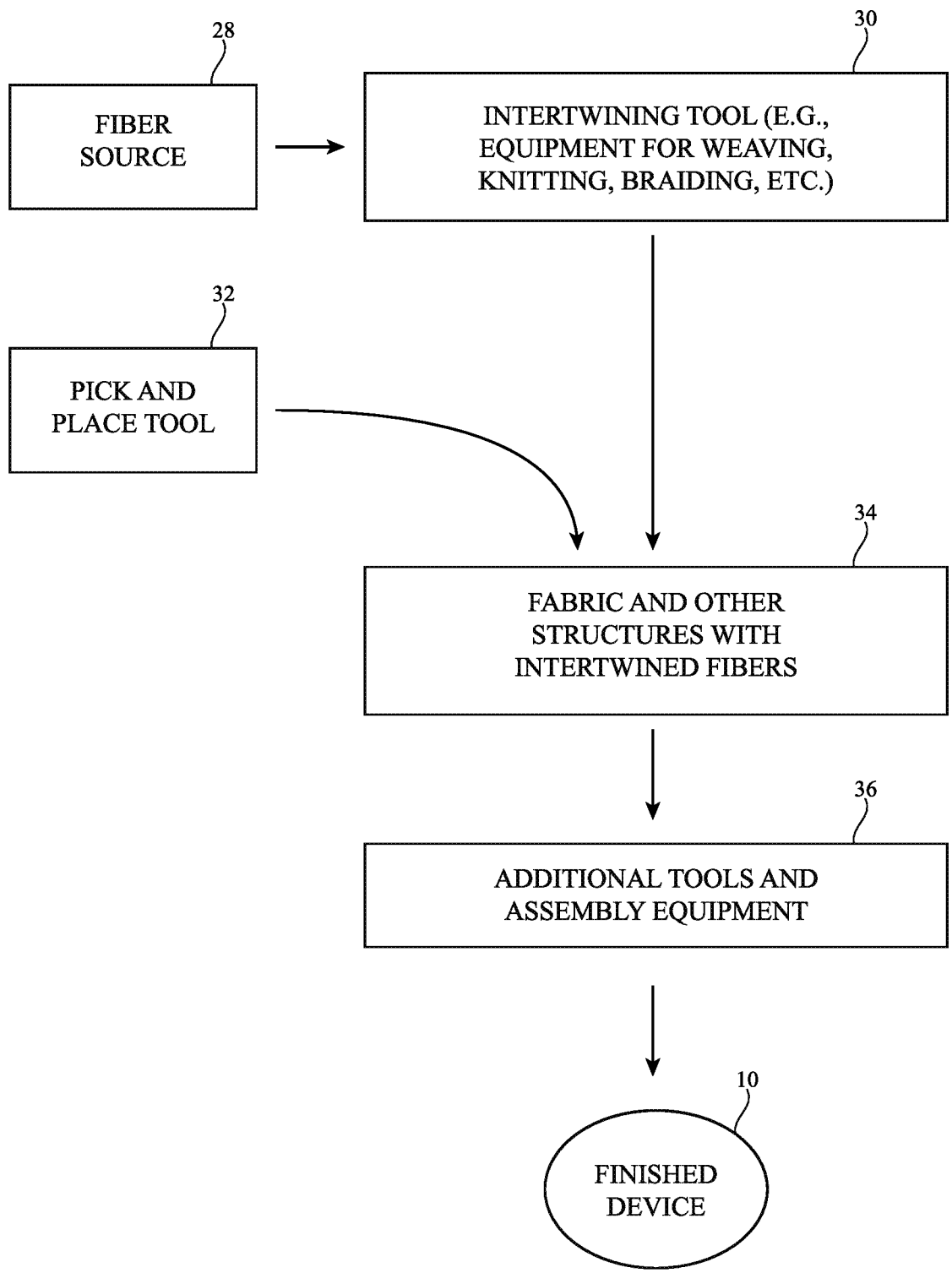
FIG. 3 is a diagram of illustrative equipment for forming an electronic device that includes electrical components mounted to fabric in accordance with an embodiment.

Illustrative equipment of the type that may be used in mounting one or more electrical components to fabric for device 10 is shown in FIG. 3. As shown in FIG. 3, the equipment of FIG. 3 may be provided with fibers from fiber source 28. The fibers provided by fiber source 28 may be single-strand filaments or may be threads, yarns, or other fibers that have been formed by intertwining single-strand filaments. Fibers may be formed from polymer, metal, glass, graphite, ceramic, natural materials such as cotton or bamboo, or other organic and/or inorganic materials and combinations of these materials. Conductive coatings such as metal coatings may be formed on non-conductive fiber cores. Fibers may also be formed from single filament metal wire or stranded wire. Fibers may be insulating or conductive. Fibers may be conductive along their entire length or may have conductive segments (e.g., metal portions that are exposed by locally removing polymer insulation from an insulated conductive fiber). Threads and other multi-strand fibers that have been formed from intertwined filaments may contain mixtures of conductive fibers and insulating fibers (e.g., metal fibers or metal coated fibers with or without exterior insulating layers may be used in combination with solid plastic fibers or natural fibers that are insulating).

The fibers from fiber source 28 may be intertwined using intertwining equipment 30. Equipment 30 may include weaving tools, knitting tools, tools for forming braided fabric, or other equipment for intertwining the fibers from source 28. Equipment 30 may be automated. For example, equipment 30 may include computer-controlled actuators that manipulate and intertwine fibers from source 28.

Components 20 may be attached to fibers in the fabric formed with equipment 30. For example, computer-controlled equipment such as pick-and-place tool 32 may be used to attach components 20 to the fibers. Components 20 may have conductive contacts (e.g., contacts formed from metal or other conductive material). Equipment 32 may attach each conductive contact in a component 20 to a respective conductive fiber using conductive connections such as solder joints, conductive adhesive connections (e.g., conductive epoxy connections), welds, crimped connections, spring contacts, connections formed using clamps, fasteners, or other structures to press metal contacts against conductive fibers, etc. Arrangements in which equipment 32 uses solder to attach components 20 to fibers from source 28 that are being formed into fabric by tool 30 are sometimes described herein as an example. This is, however, merely illustrative. In general, any suitable conductive attachment mechanism may be used to electrically couple one or more terminals in each component 20 to a respective conductive fiber in a fabric for device 10. Adhesive and other attachment mechanisms may also be used to attach insulating fibers to component 20.

After using intertwining tool 30 and pick-and-place tool 32 to form fabric and other structures 34 with embedded components 20, additional processing steps may be performed using equipment 36. Equipment 36 may include equipment for assembling control circuitry 24, components 26, and other structures for device 10 with the fabric produced by equipment 32 and 30, thereby forming all or part of finished device 10. Equipment 36 may include injection molding tools, tools for applying coatings, cutting and machining equipment, assembly equipment for attaching structures together using fasteners, adhesive, and other attachment mechanisms, equipment for interconnecting connectors on printed circuits and other signal path substrates, etc.

Figure 4:
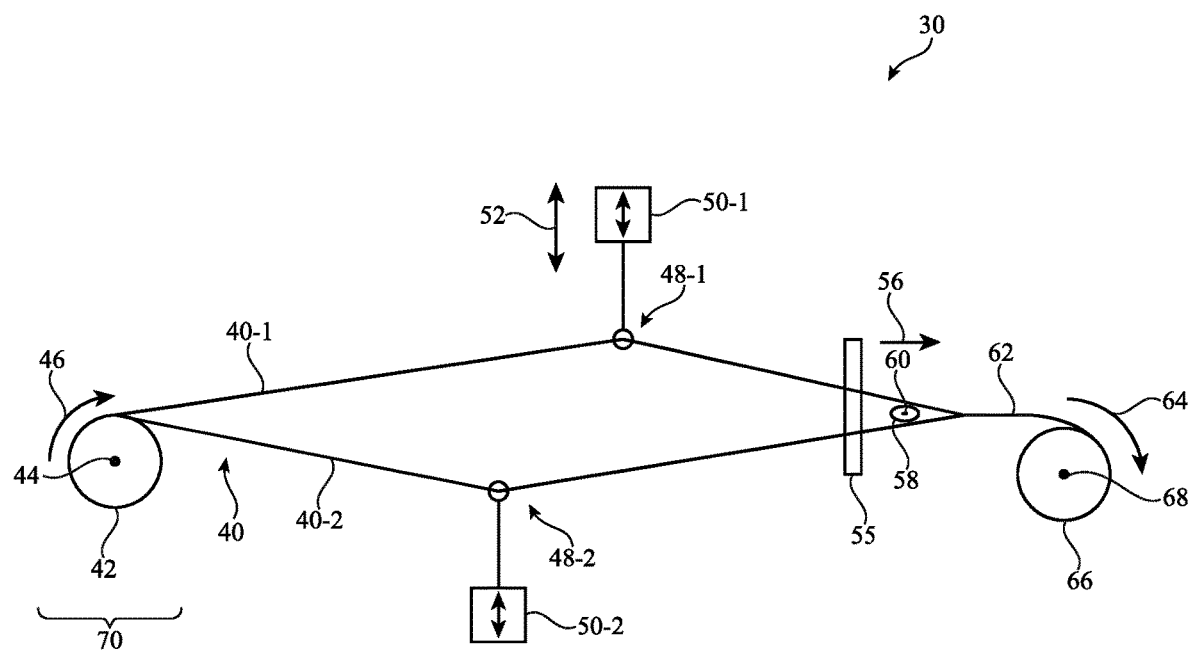
FIG. 4 is a side view of illustrative weaving equipment that may be used to form fabric in accordance with an embodiment.

If desired, intertwining tool 30 may be a weaving machine. Illustrative weaving equipment is shown in FIG. 4. As shown in FIG. 4, weaving equipment 30 includes a source of warp fibers such as source 70. Source 70 may include a drum or other structure such as drum 42 that rotates about rotational axis 44 in direction 46. Warp fibers 40-1 and warp fibers 40-2 may be dispensed as drum 42 rotates.

Warp fibers 40-1 may be positioned using computer-controlled positioner 50-1 and needles 48-1 or other fiber guiding structures. Warp fibers 40-2 may be positioned using computer-controlled positioner 50-2 and needles 48-2 or other fiber guiding structures. Positioners 50-1 and 50-2 may travel along vertical axis 52 (e.g. to move warp fibers 40-1 down while moving warp fibers 40-2 up to swap the positions of fibers 40-1 and 40-2).

Shuttle 58 or other weft fiber positioning equipment may be used to insert weft fiber 60 between warp fibers 40-1 and 40-2 (e.g., by moving weft fiber 60 into the page and out of the page in the orientation of FIG. 4. After each pass of shuttle 58, reed 55 may be moved in direction 56 (and then retracted) to push the weft fiber that has just been inserted between warp fibers 40-1 and 40-2 against previously woven fabric 62, thereby ensuring that a satisfactorily tight weave is produced. Fabric 62 that has been woven in this way may be gathered on drum 66 as drum 66 rotates in direction 64 about rotational axis 68.

The equipment of FIG. 4 may be controlled using computing equipment. For example, computing equipment may control the positions of needles 48-1 and 48-2 using positioners 50-1 and 50-2 and computer-controlled positioners may be used in controlling the movement of reed 55, shuttle 58, and drums 42 and 66. The computing equipment may also control equipment for installing components 20 in fabric 62. With one suitable arrangement, computer-controlled equipment such as pick-and-place machine 32 of FIG. 3 may be used to solder components 20 to fibers in fabric 62.

Figure 5:
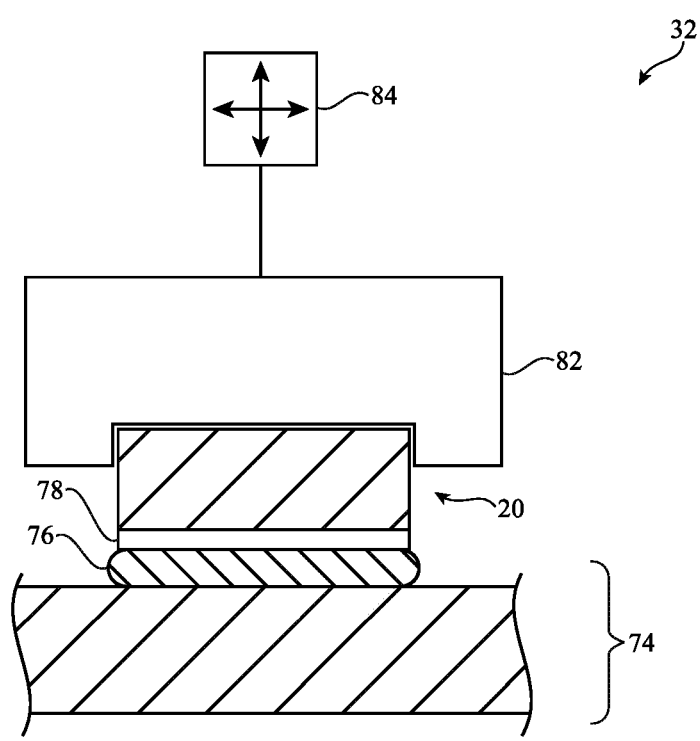
FIG. 5 is a side view of an illustrative pick-and-place machine for mounting electrical components to fabric in accordance with an embodiment.

An illustrative pick-and-place machine is shown in FIG. 5. As shown in FIG. 5, pick-and-place machine 32 may include computer-controlled actuators such as computer-controlled positioner 84. Positioner 84 may be used to position pick-and-place head 82. Head (nozzle) 82 may include a vacuum suction structure or other gripping device for gripping components such as component 20. Components 20 may be fed into machine 32 on a reel of tape or other suitable component dispensing structure.

When it is desired to mount component 20 to a fiber in fabric 62 such as fiber 74 (e.g., a warp fiber or a weft fiber in a woven fabric), head 82 may be positioned so that conductive material 76 is interposed between component 20 and fiber 74. Fiber 74 may be a bare metal wire, a metal-coated insulating fiber, a metal wire or metal-coated insulating fiber with a locally stripped insulating coating, a multi-strand fiber that contains at least one metal fiber or metal-coated fiber, or other conductive fiber. Component 20 may have metal contacts such as contact 78. Conductive material 76 may be solder, conductive adhesive, or other conductive material for connecting contact 78 to conductive fiber 74 and thereby electrically and mechanically joining component 20 to fiber 74. Conductive material 76 such as solder may be dispensed in the form of solder paste that is heated (reflowed) using a heating element in head 82 and/or using an external source of heat. Solder paste 76 may be carried with components 20 on the tape reel in machine 32, may be applied as part of the process of attaching component 20 to fiber 74, and/or may be applied to fiber 74 before mounting component 20. If desired, different types of solder may be used in forming joints for different contacts 78 on a single component. For example, solders that melt (flow) at different temperatures may be used to form different connections.

Figure 6:
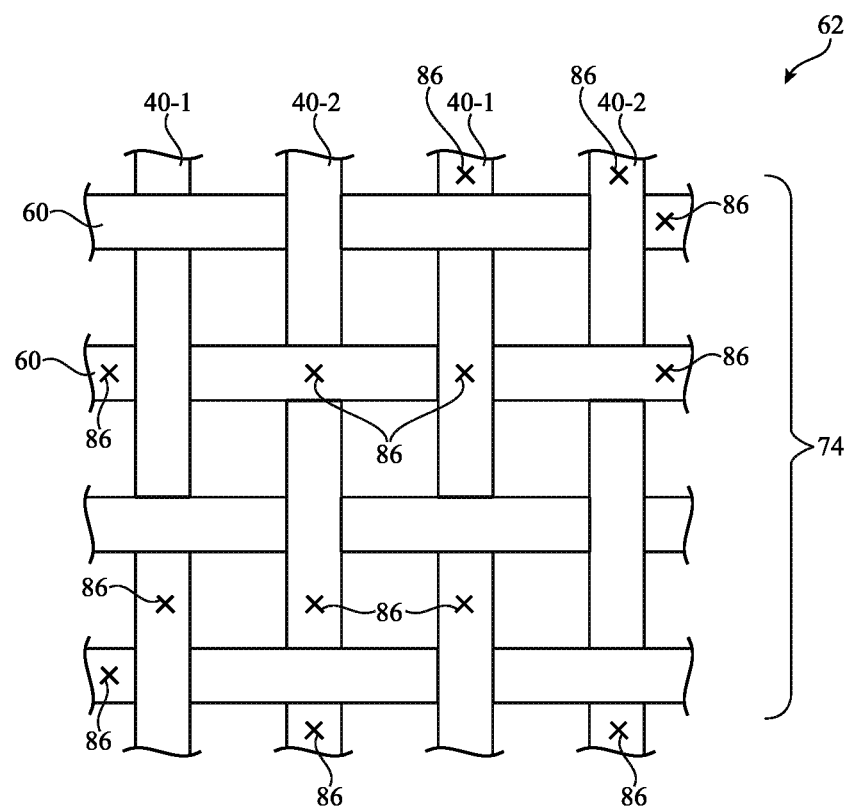
FIG. 6 is a top view of a portion of an illustrative fabric in accordance with an embodiment.

FIG. 6 is a top view of an illustrative fabric having fibers 74 to which components 20 may be mounted using pick-and-place tool 32. In the example of FIG. 6, fabric 62 is a woven fabric that has a plain weave and includes warp fibers 40-1 and 40-2 and weft fibers 60. In general, fabric 62 may include any intertwined fibers 74 (woven, knitted, braided, etc.). The plain weave fabric of FIG. 6 is merely illustrative. Fabric 62 may contain conductive fibers and/or may contain a mixture of conductive and insulating fibers. The contacts 78 of components 20 may be electrically coupled to the conductive fibers in fabric 62.

Illustrative soldering locations 86 of the type where contacts 78 of components 20 may be soldered to fibers 74 are shown in FIG. 6. Components 20 may have two or more terminals (contacts 78), three or more terminals, four or more terminals, or other suitable number of terminals. In configurations in which components 20 each have a pair of terminals, one terminal may be coupled to a conductive warp fiber and another terminal may be coupled to a conductive weft fiber, first and second terminals may be coupled to a common conductive warp fiber or to two different conductive warp fibers, or first and second terminals may be coupled to a common conductive weft fiber or to two different conductive weft fibers. In configurations in which components 20 each have three or more terminals, additional combinations of warp and weft fibers may be coupled to the terminals. A pair of soldering locations 86 for a component may be located on horizontally adjacent fibers 74, may be located on vertically adjacent fibers 74, may be located along a diagonal line that runs across fabric 62, may be formed on fibers 74 that are separated by intervening insulating fibers 74 or other fibers 74 to which connections are not made, or may be located on any other suitable first and second respective positions on fibers 74.

Figure 7:
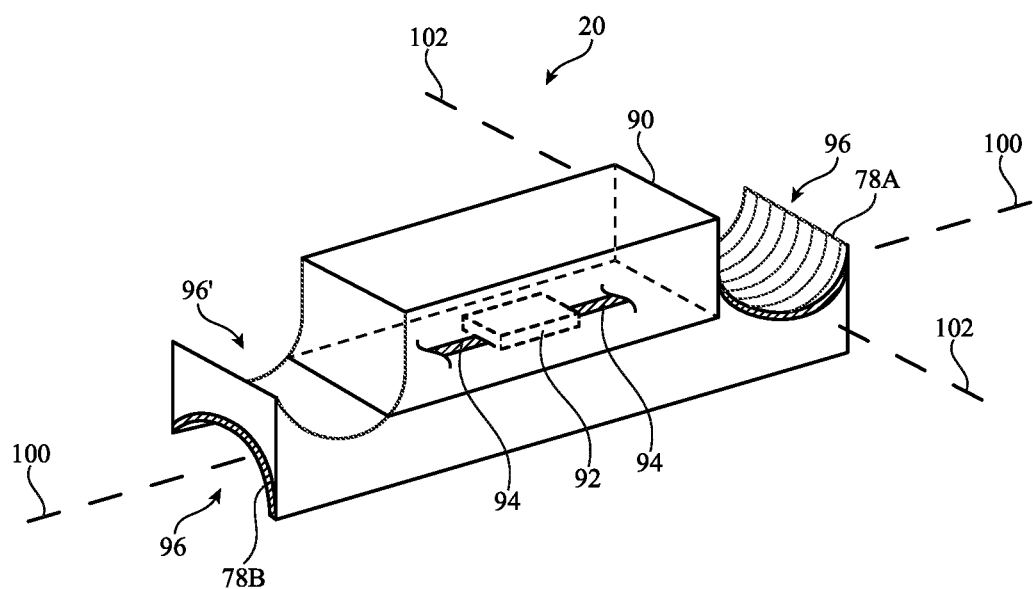
FIG. 7 is a perspective view of an illustrative electrical component having a package of the type that may be used to facilitate attachment of the electrical component to a fabric in accordance with an embodiment.

FIG. 7 is a perspective view of an illustrative electrical component of the type that may be attached to fibers 74 in fabric 62. In the example of FIG. 7, component 20 has a package such as package 90. Package 90 may be formed from plastic, ceramic, or other materials. Component 20 may include one or more electrical devices such as device 92. Devices such as device 92 may include one or more semiconductor dies or other circuits. For example, device 92 may be a silicon integrated circuit, a silicon-based microelectromechanical systems device such as a sensor, a capacitor, inductor, or resistor, a compound semiconductor die that forms a light-emitting diode or light detector, a semiconductor substrate that is configured to form a membrane for a microphone or a diving board structure for a sensor or other component, or semiconductor switch or driver circuit, or other suitable electrical device. Devices 92 may be shielded using conductive shield structures and may be encased within an enclosure such as package 90. If desired, a printed circuit board or other substrate with traces may be enclosed within package 90 (e.g., devices 92 may be mounted to a printed circuit before encasing the printed circuit and devices 92 within a plastic package body using injection molding techniques). Signal lines in component 20 may be formed from metal traces 94 on a printed circuit or other structures in component 20. Metal traces 94 may be used to couple the terminals of electrical device 92 or other circuitry to component contacts in component 20.

If desired, package body 90 may be provided with fiber guiding structures that receive and hold fibers 74. The guiding structures may include posts, walls, or other protrusions, flat sided and curved recesses forming grooves, combinations of protrusions and recesses, or other structures that receive fibers 74 and help prevent fibers 74 from slipping off of body 90. In the illustrative example of FIG. 7, package body 90 has grooves such as grooves 96 and 96'. The upper surface of body 90 has parallel grooves and the lower surface of body 90 has a perpendicular groove.

Contacts for component 20 may be formed in these grooves or elsewhere on the exterior of body 90. For example, a first contact such as contact 78A may be formed on a first of grooves 96 and a second contact such as contact 78B may be formed on a second of grooves 96. Contacts 78A and 78B may be formed from a solder-compatible metal. Traces 94 may couple contacts 78A and 78B to respective electrical terminals of device 92 and/or other circuitry in package body 90. If desired, component 20 may have additional contacts. For example, an additional contact may be formed in groove 96' and may be soldered to another conductive fiber. Insulating fibers and other fibers may also be mounted in groove 96' using adhesive (e.g., to provide structural support without providing any electrical signal path). The arrangement of FIG. 7 is merely illustrative.

Figure 8:
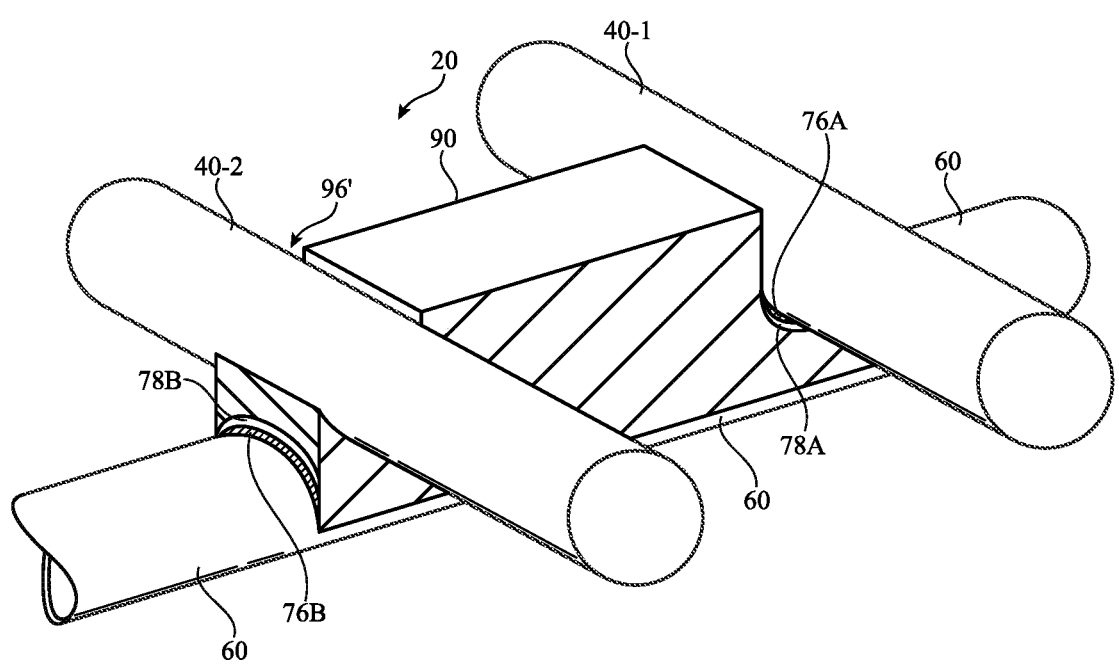
FIG. 8 is a perspective view of the electrical component of FIG. 7 following attachment to fibers in a fabric in accordance with an embodiment.

In the example of FIG. 7, component 20 has an elongated shape that extends along longitudinal axis 100. Contact 78B extends along the groove in package 90 that runs parallel to axis 100. Contact 78A extends along the groove in package 90 that runs along perpendicular axis 102. When installed within fabric 62, axis 100 may be aligned with weft fibers 60 and axis 102 may be aligned with warp fibers 40-1 and 40-2 (or vice versa). As shown in FIG. 8, for example, contact 78B may be a weft fiber contact that is soldered to weft fiber 60 with solder 76B and contact 78A may be a warp fiber contact that is soldered to warp fiber 40-1 with solder 76A. Warp fiber 40-2 may be an insulating fiber that is attached to package 90 with adhesive but that is not electrically coupled to a contact in component 20 or warp fiber 40-2 may be a conductive fiber that is soldered to a contact in groove 58'.

If desired, solder 76B and solder 76A may be formed from different types of solder and may exhibit different melting temperatures. This may facilitate attachment of component 20 to fabric 62 using pick-and-place equipment 32 as fabric 62 is woven using equipment 30.

Illustrative steps involved in mounting component 20 to fabric 62 during weaving operations are shown in FIGS. 9, 10, 11, 12, 13, and 14.

Figure 9:
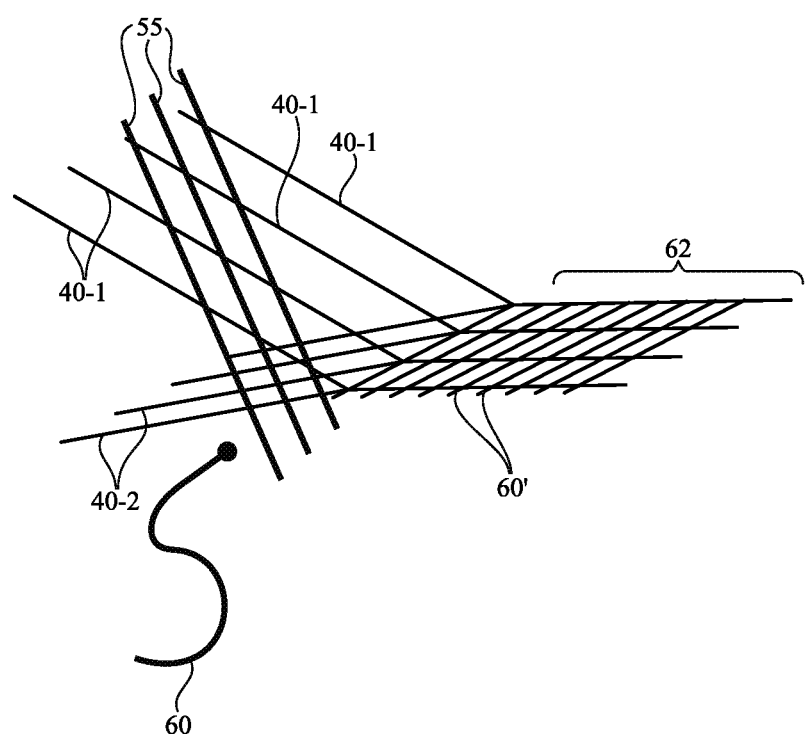
FIG. 9 is a diagram of a portion of a weaving machine showing how a weft fiber may be inserted between two sets of warp fibers in accordance with an embodiment.

FIG. 9 is a diagram of a portion of weaving machine being used to produce fabric 62. As shown in FIG. 9, woven fabric 62 includes weft fibers 60' intertwined with warp fibers 40-1 and 40-2. Using equipment of the type shown in FIG. 4, a weft fiber such as weft fiber 60 may be inserted between warp fibers 40-1 and warp fibers 40-2.

Figure 10:
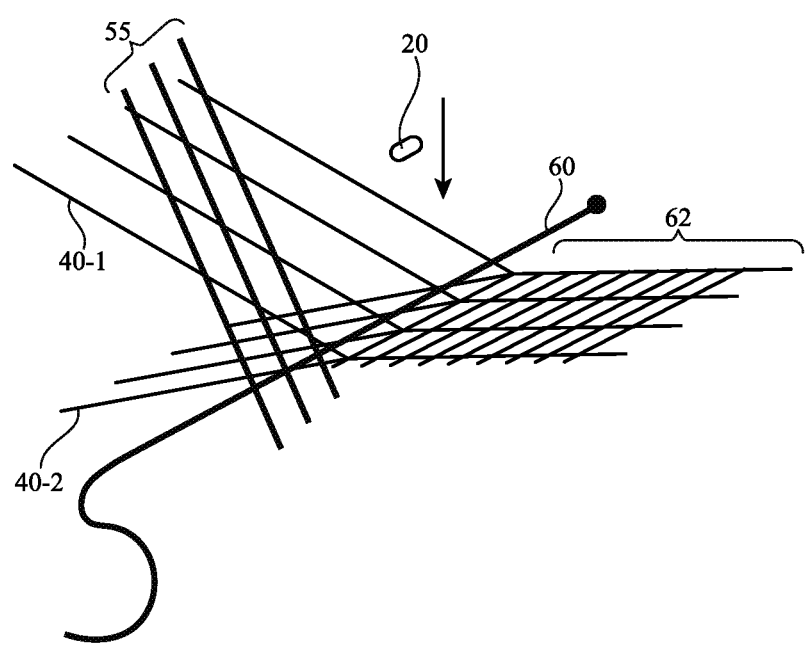
FIG. 10 is a diagram of the weaving machine of FIG. 9 showing how a pick-and-place machine may be used in aligning an electronic component with a weft fiber after the weft fiber has been inserted between the warp fibers in accordance with an embodiment.

Following insertion of weft fiber 60, a pick-and-place machine such as pick-and-place machine 32 of FIG. 3 may bring component 20 into alignment with weft fiber 60, as shown in FIG. 10.

Figure 11:
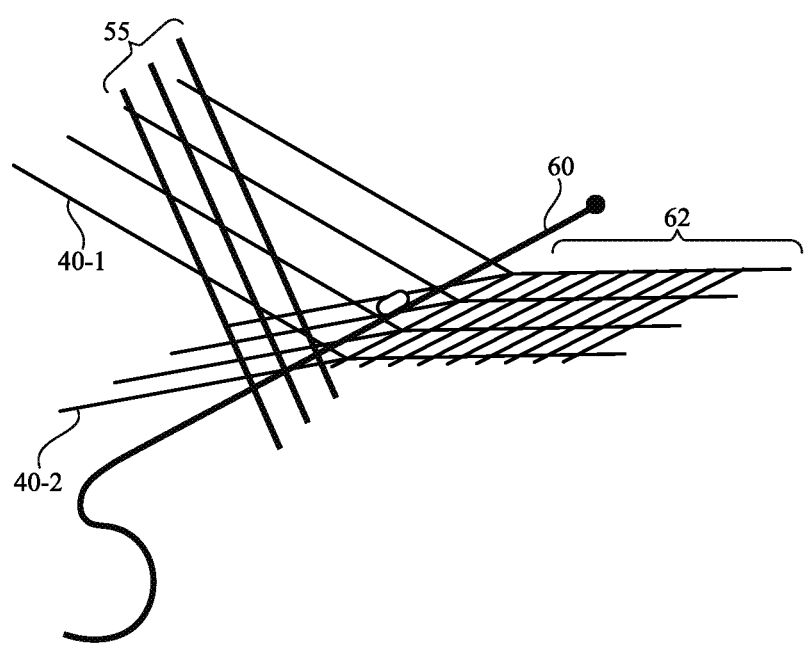
FIG. 11 is a diagram of the weaving machine of FIG. 10 following attachment of the electronic component to the weft fiber with the pick-and-place machine in accordance with an embodiment.

Pick-and-place machine 32 may then solder contact 78B of component 20 to weft fiber 60 using solder 76B, as shown in FIG. 11. Solder 76B may have a first melting temperature T1 (e.g., 180° C. or other suitable temperature).

Figure 12:
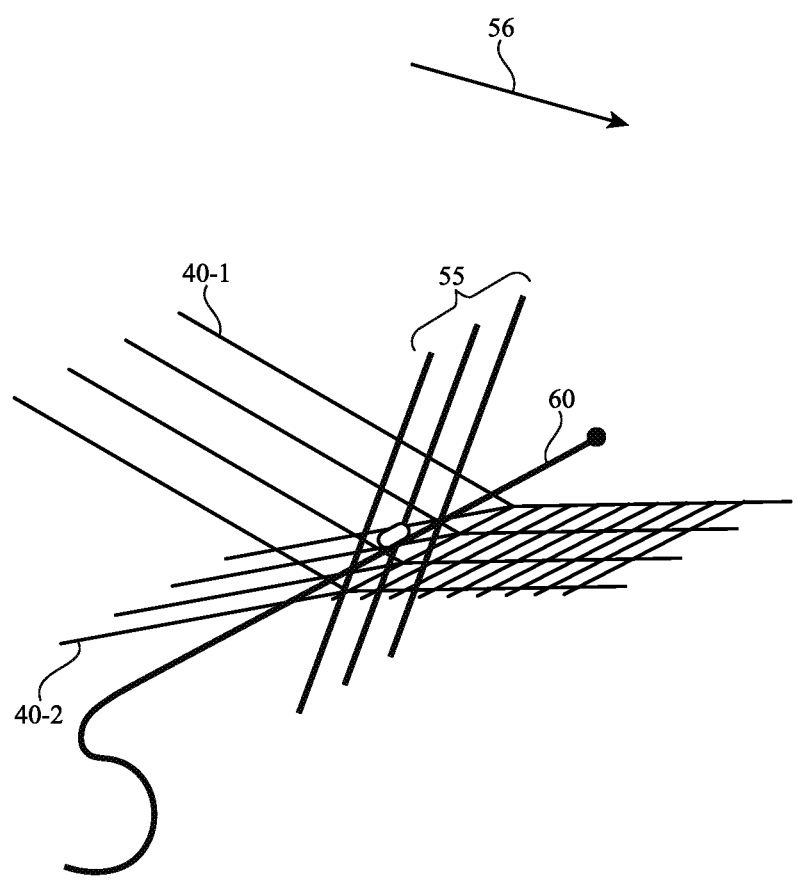
FIG. 12 is a diagram of the weaving machine of FIG. 11 in a configuration in which a reed in the weaving machine is pushing the weft fiber into place in accordance with an embodiment.

After component 20 has been soldered to weft fiber 60 using contact 78B, reed 55 may be moved (e.g., rotated) in direction 56 to press weft fiber 60 in place between warp fibers 40-1 and 40-2, as shown in FIG. 12. As reed 55 moves, component 20 may rotate freely in response to any rotation of the weft fiber 60 to which component 20 is attached.

Figure 13:
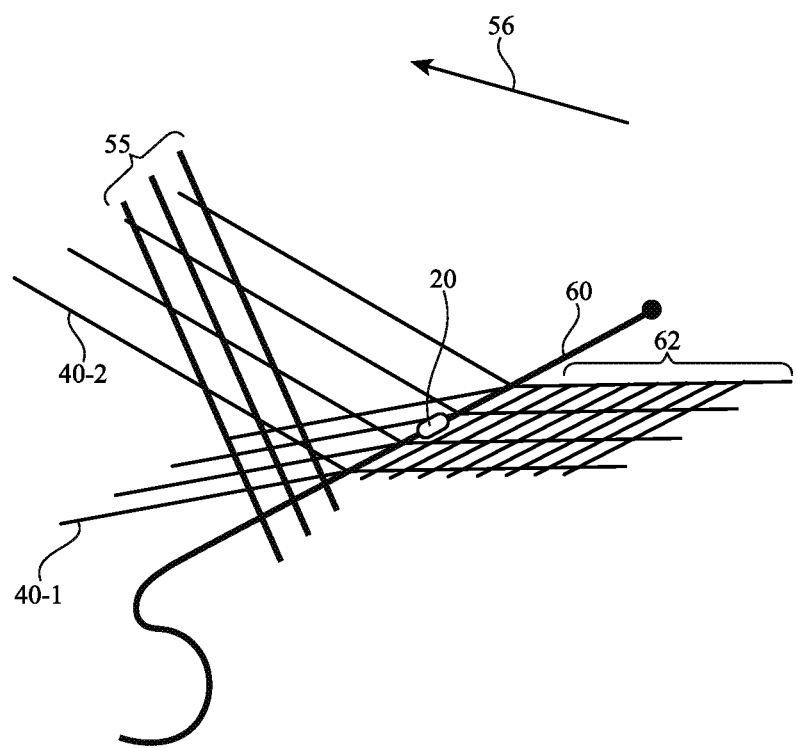
FIG. 13 is a diagram of the weaving machine of FIG. 12 following removal of the reed from the weft fiber and movement of the upper warp threads on top of the electrical component so that the pick-and-place machine can attach the electrical components to a signal path in the upper warp threads in accordance with an embodiment.

As shown in FIG. 13, reed 55 may then be moved in direction 57 and needles 48-1 and 48-2 may be moved to switch the locations of warp fibers 40-1 and warp fibers 40-2. As the warp fibers swap locations, the warp fibers adjacent to component 20 are received within warp fiber grooves 96 and 96' on the upper surface of package 90, thereby locking component 20 in place within fabric 62. To secure component 20 and complete the electrical coupling process, pick-and-place machine 32 may solder contact 78A to the warp line in groove 96 using solder 76A (and, if desired, may form a solder connection to the warp line in groove 96' using a real contact or a dummy contact at the opposing end of package 90). Solder 76A may have a second melting temperature T2 (e.g., 160° C. or other suitable temperature). Melting temperature T2 may be lower than melting temperature T1, so the soldering operations used in forming the second solder joint for the warp fiber(s) do not disrupt the previously formed solder joint for the weft fiber.

Figure 14:
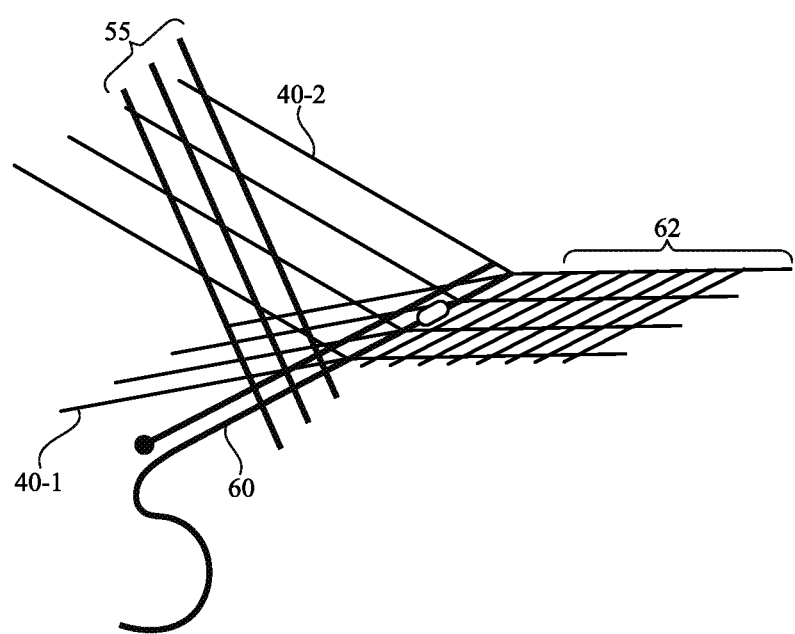
FIG. 14 is a diagram of the weaving machine of FIG. 13 showing how the weaving process may continue following attachment of the electrical component to both weft and warp fibers in accordance with an embodiment.

Once warp fiber soldering operations have been completed, weaving can continue by passing weft fiber 60 back through warp fibers 40-2 and 40-1, as shown in FIG. 14.

Any suitable number of components 20 may be soldered to fabric 62 using pick-and-place machine 32 (e.g., one, two or more, ten or more, one hundred or more, one thousand or more, less than 5,000, 1000-100,000, more than 500,000, etc.). The components that are soldered to fabric 62 may all be of the same type or a mixture of different types of components may be used.

Figure 15:
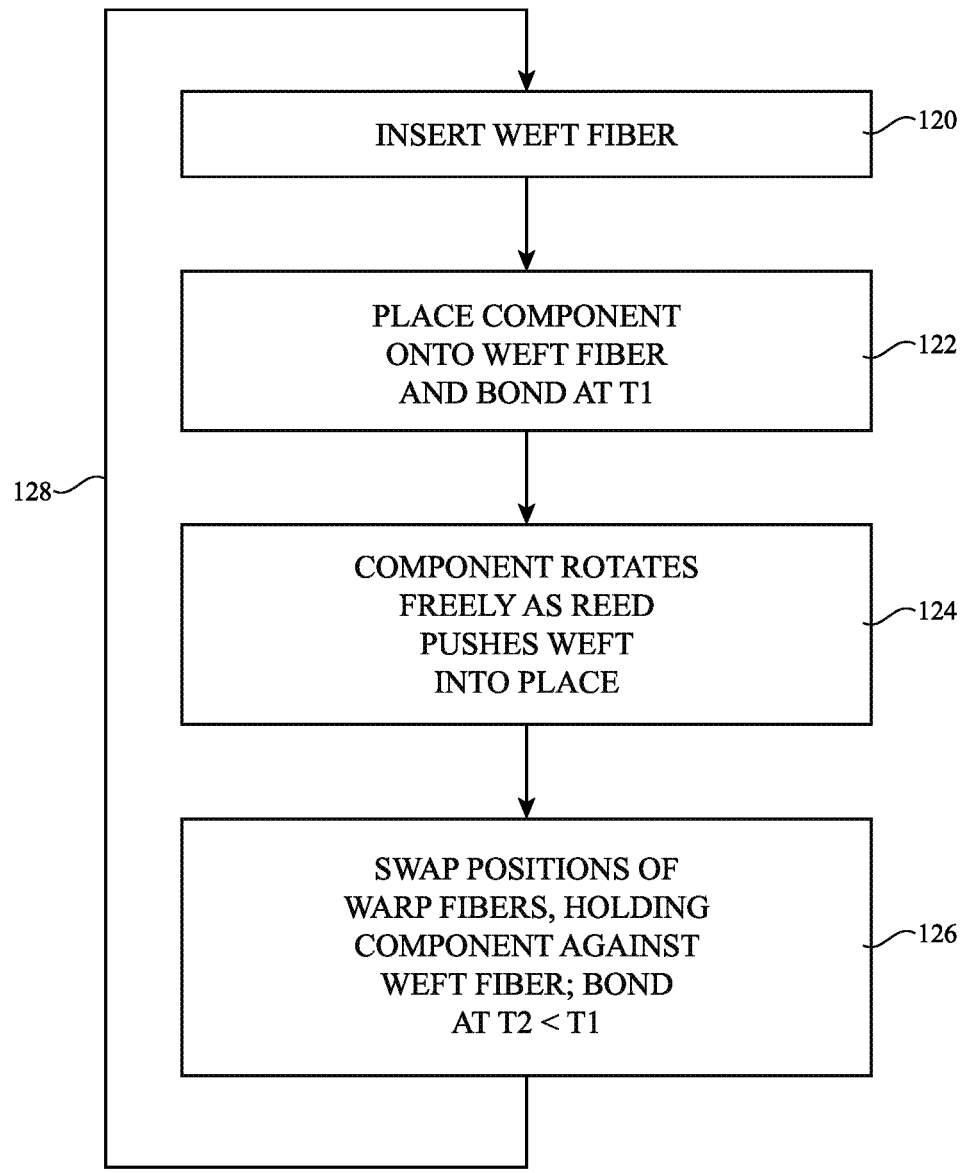
FIG. 15 is a flow chart of illustrative steps involved in attaching electrical components to fibers while forming a fabric for an electronic device in accordance with an embodiment.

Illustrative steps involved in forming fabric 62 using operations of the type shown in FIGS. 9, 10, 11, 12, 13, and 14 are shown in the flow chart of FIG. 15.

At step 120, weft fiber 60 may be inserted between warp fibers 40-1 and 40-2 using shuttle 58 in weaving machine 30.

At step 122, pick-and-place machine 32 may solder component 20 to weft fiber 60 using solder 76B and contact 78B (i.e., so that longitudinal axis 100 of package 90 runs parallel to weft fiber 60).

At step 124, reed 55 pushes weft fiber 60 into place. Component 20 may rotate freely with any rotation of fiber 60.

At step 126, the positions of warp fibers 40-1 and 40-2 are swapped. As part of this process, one or more of the warp fibers are received within the groove structures or other guiding structures formed in package 90 of component 20. Pick-and-place machine 32 solders one or more warp fibers to component 20. For example, the warp fiber 40-1 in groove 96 may be soldered to contact 78A using solder 76A. Solder 76A may have a lower melting point than solder 76B, so that the solder joint that was formed with solder 76B will not be disrupted while forming the solder joint with solder 76A.

Weaving may then continue, as illustrated by line 128 of FIG. 15.

If desired, other arrangements may be used for securing conductive fibers in fabric 62 to contacts in component 20 (e.g., crimped metal tabs, holes lined with metal contacts, grooves that run across package 90 diagonally or with other configurations, mating parts in package 90 that clamp onto conductive fiber, etc.). Some fibers may overlap package 90 and may help to hold package 90 and components 20 in place within fabric 62. A configuration that may be used for package 90 in this type of arrangement is shown in FIG. 16.

Figure 16:
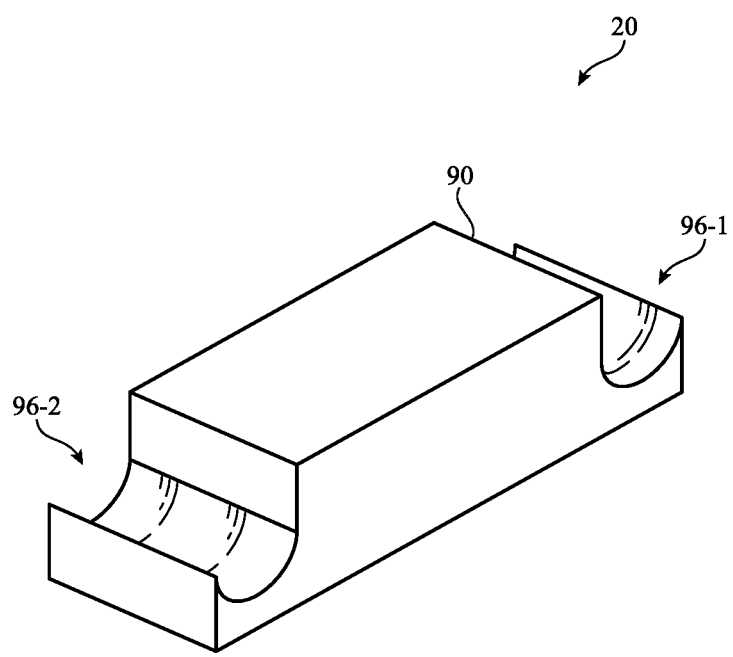
FIG. 16 is a perspective view of an illustrative electrical component with parallel grooves for fiber attachment in accordance with an embodiment.

Package 90 of component 20 of FIG. 16 has first groove 96-1 and second groove 96-2, each of which may have a respective electrical contact for component 20. Grooves 96-1 and 92-2 may be parallel grooves or other fiber guiding structures that are formed on opposing ends (sides) of component 20 and that are configured to receive respective conductive fibers in fabric 62 (e.g., warp or weft fibers).

Figure 17:
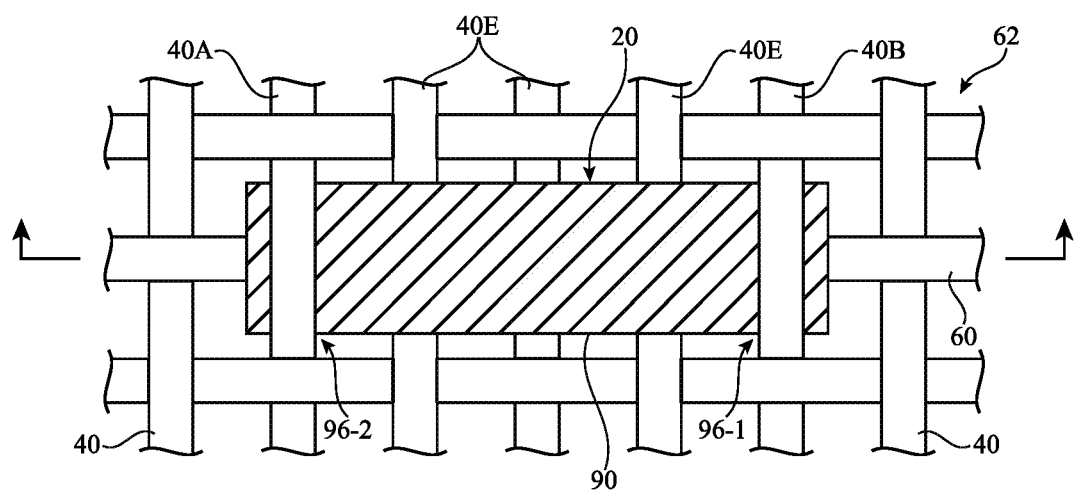
FIG. 17 is a top view of an illustrative electrical component of the type shown in FIG. 16 following mounting to fibers in a fabric in accordance with an embodiment.

FIG. 17 is a top view of electrical component 20 of FIG. 16 in an illustrative configuration in which a first warp fiber 40A among warp fibers 40 has been soldered to a contact in groove 96-1 and a second warp fiber 40B has been soldered to a contact in groove 96-2. Three warp fibers 40E overlap package 90. If desired, one warp fiber 40E may overlap package 90 or more than two fibers 40E may overlap package 90. Warp fibers 40E lie between fibers 40A and 40B and run parallel to fibers 40A and 40B. Fibers 40E may be insulating fibers or conductive fibers.

Figure 18:
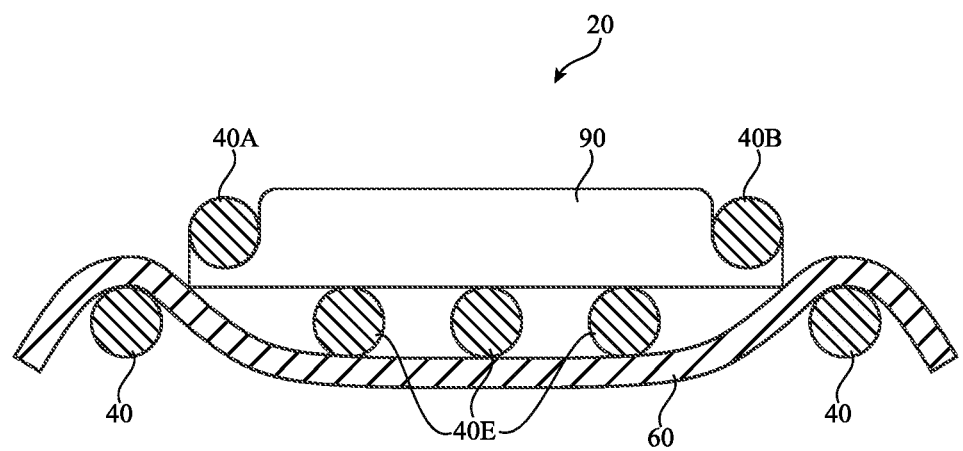
FIG. 18 is a side view of the illustrative electrical component and fabric of FIG. 17 in accordance with an embodiment.

FIG. 18 is a cross-sectional side view of component 20 of FIG. 17 taken along line 130 and viewed in direction 132. As shown in FIG. 18, warp fibers 40E may help hold component 20 in place on top of weft fiber 60 in fabric 62 by forming a retention pocket for package 90.

In general, components 20 may be embedded into fabric 62 during any suitable fiber intertwining operations (e.g., during weaving, knitting, braiding, etc.) using any suitable type of component mounting equipment and fiber intertwining equipment. The mounting equipment may include heating elements for melting solder, forming welds, curing adhesive, molding package 90, etc., and/or may include mechanical equipment for screwing screws into package 90, for crimping metal tabs, and otherwise mechanically processing components 20 (e.g., to form electrical connections with fibers). The mounting equipment may also include equipment for dispensing adhesive, for applying light (e.g., laser light), for manipulating fibers, etc.

Figure 19:
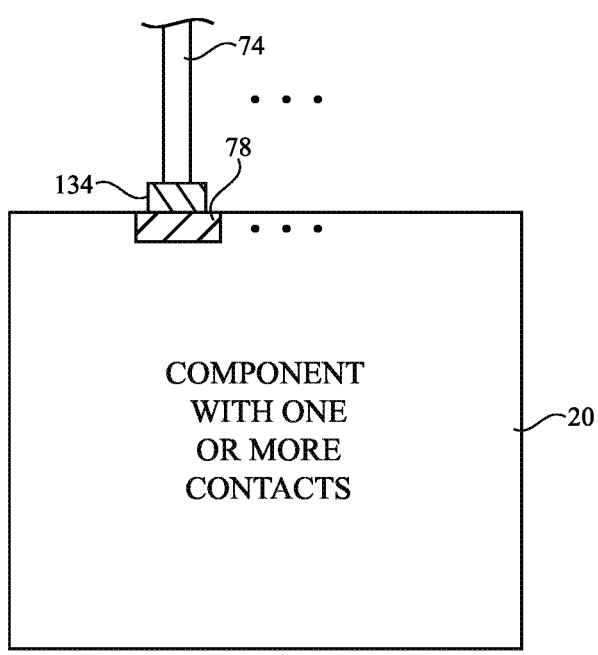
FIG. 19 is a schematic diagram of an illustrative component incorporated into fabric in accordance with an embodiment.

As shown in the schematic diagram of FIG. 19, component 20 may have one or more contacts 78 that are electrically connected to one or more fibers 74 using one or more respective electrical connections 134. Component 20 may have a body with any suitable shape (circular, oblong, spherical, box-shaped, pyramidal, etc.), may have a body formed from any suitable material (plastic, glass, ceramic, crystalline material, metal, fiber-based composites, etc.), and may contain any suitable electronic device or devices such as light-emitting components, integrated circuits, light-emitting diodes, light-emitting diodes that are packaged with transistor-based circuitry such as communications circuitry and/or light-emitting diode driver circuitry that allows each component to operate as a pixel in a display, discrete components such as resistors, capacitors, and inductors, audio components such as microphones and/or speakers, sensors such as touch sensors (with or without co-located touch sensor processing circuitry), accelerometers, temperature sensors, force sensors, microelectromechanical systems (MEMS) devices, transducers, solenoids, electromagnets, pressure sensors, light-sensors, proximity sensors, buttons, switches, two-terminal devices, three-terminal devices, devices with four or more contacts, etc. Electrical connections 134 may be formed using solder, conductive adhesive, welds, molded package parts, mechanical fasteners, wrapped fiber connections, press-fit connections, and other mechanical connections, or using any other suitable arrangement for forming an electrical short between conductive structures.

Figure 20:
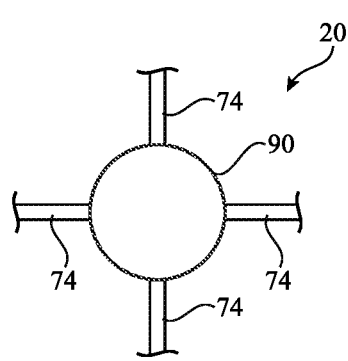
FIG. 20 is a diagram of an illustrative component with a circular shape that is coupled to fibers in a fabric in accordance with an embodiment.

As shown in FIG. 20, component 20 may have a circular body that is connected to one or more fibers 74.

Figure 21:
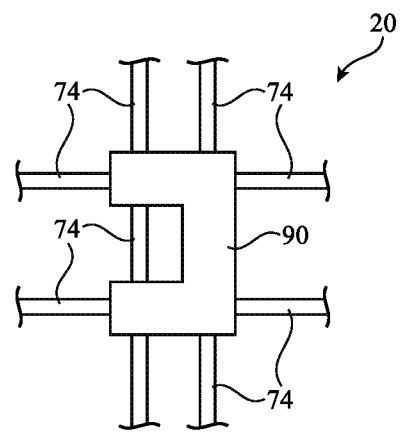
FIG. 21 is a diagram of an illustrative component with a C shape that is coupled to fibers in a fabric in accordance with an embodiment.

FIG. 21 is a diagram of an illustrative component with a C-shape body that is coupled to fibers 74.

Figure 22:
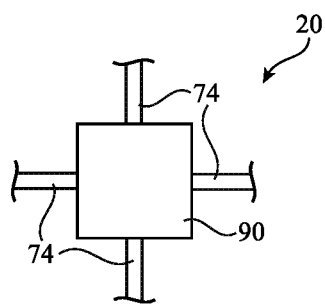
FIG. 22 is a diagram of an illustrative component with a square shape that is coupled to fibers in a fabric in accordance with an embodiment.

FIG. 22 shows how body 90 of component 20 may have a square shape.

Figure 23:
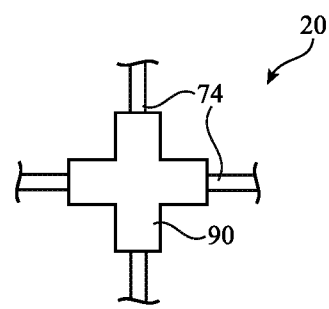
FIG. 23 is a diagram of an illustrative component with a cross shape that is coupled to fibers in a fabric in accordance with an embodiment.

FIG. 23 shows how body 90 of component 20 may have a cross shape.

Figure 24:
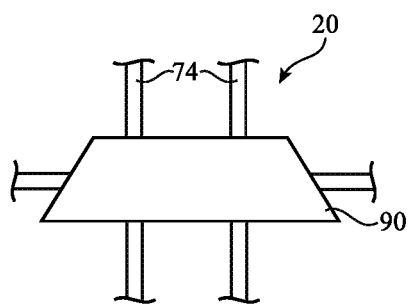
FIG. 24 is a diagram of an illustrative component with a trapezoidal shape that is coupled to fibers in a fabric in accordance with an embodiment.

FIG. 24 shows how body 90 of component 20 may have a trapezoidal shape.

Figure 25:
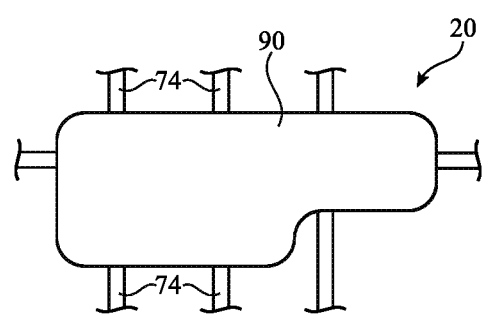
FIG. 25 is a diagram of an illustrative component with a shape having a combination of curved and straight edges that is coupled to fibers in a fabric in accordance with an embodiment.

In the example of FIG. 25, body 90 has a shape with a combination of curved and straight edges.

Other shapes may be used for body 90 if desired. The examples of FIGS. 20, 21, 22, 23, 24, and 25 are merely illustrative. Moreover, any number of fibers 74 may be coupled to any of these body types and/or components 20 of other shapes (e.g., one warp fiber and one weft fiber, two warp fibers and one weft fiber, two weft fibers and one warp fiber, multiple warp fibers, multiple weft fibers, three or more fibers of any time, fibers in a knitted or braided fabric, etc.).

FIGS. 26, 27, 28, 29, 30, 31, 32, and 33 are side views of illustrative components 20 (or portions of components 20) showing various connection arrangements (e.g., examples of connection 134 of FIG. 19).

Figure 26:
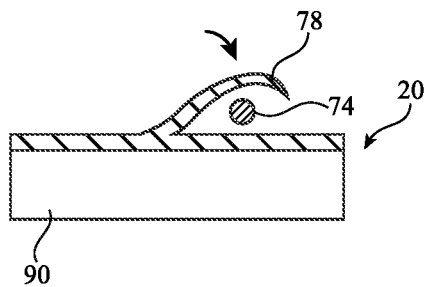
FIG. 26 is a side view of an illustrative electrical component having a crimped fiber connection in accordance with an embodiment.

FIG. 26 is a side view of component 20 in a configuration in which contact 78 is formed of metal (e.g., a bendable metal tab) or other conductive material that forms a crimped electrical connection to fiber 74.

Figure 27:
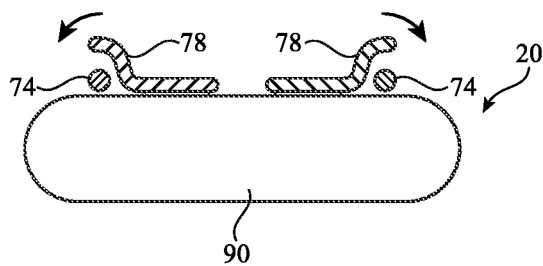
FIG. 27 is a side view of an illustrative electrical component having a pair of crimped fiber connections on a component body with a rounded edge profile in accordance with an embodiment.

FIG. 27 is a side view of component 20 in a configuration with a pair of crimped fiber connections are being made to fibers 74 and in which body 90 has a rounded edge profile.

Figure 28:
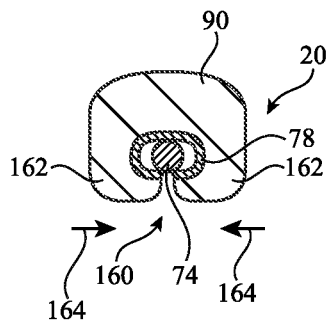
FIG. 28 is a side view of an illustrative electrical component having a press-fit fiber connection in accordance with an embodiment.

FIG. 28 is a side view of an illustrative electrical component having a press-fit fiber connection. In this type of arrangement, fiber 74 is forced through narrow opening 160, which causes portions 162 of body 90 to temporarily spread outward. When portions 162 relax in directions 164, fiber 74 is pressed against contact 78.

Figure 29:
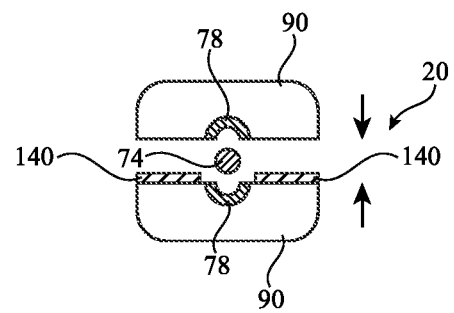
FIG. 29 is a side view of an illustrative electrical component having a clamped fiber connection in accordance with an embodiment.

As shown in FIG. 29, body 90 may have two portions that are coupled using adhesive 140, thereby trapping fiber 74 against contact 78 (i.e., component 20 may form a clamped-fiber connection to fiber 74).

Figure 30:
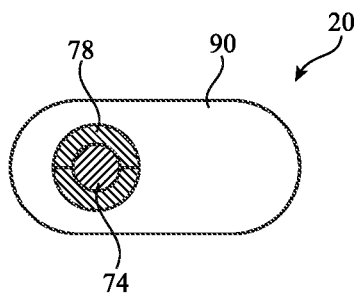
FIG. 30 is a side view of an illustrative electrical component having a molded fiber connection in accordance with an embodiment.

FIG. 30 shows how body 90 may be molded around contact 78 and fiber 74 (e.g., using plastic molding equipment). Contact 78 may be, for example, a metal structure that is crimped onto fiber 74 during the fabric formation process. Molded connections of the type shown in FIG. 30 may be formed by molding plastic in body 90 around fiber 74 or by otherwise using heat to cause plastic or other material to mold into a desired shape to form an electrical connection with fiber 74.

Figure 31:
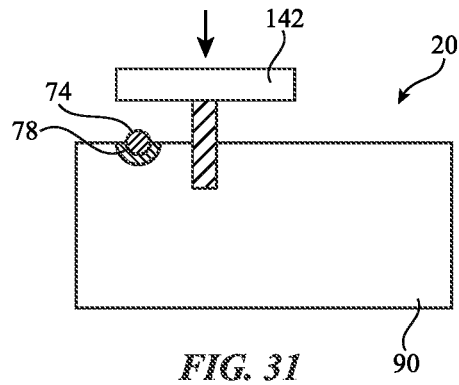
FIG. 31 is a side view of an illustrative electrical component having a fastener that forms a fastener-based fiber connection in accordance with an embodiment.

As shown in FIG. 31, fasteners such as screw 142 may be screwed into body 90 to hold fiber 74 against contact 78.

Figure 32:
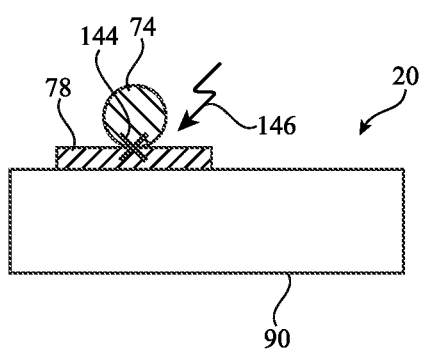
FIG. 32 is a side view of an illustrative electrical component having a welded fiber connection in accordance with an embodiment.

As shown in FIG. 32, laser light 146 or heat from another source may be used to weld fiber 74 (e.g., a metal fiber) onto contact 78. Welded connections may be formed without using solder or may be combined with solder-based connection arrangements or other electrical connections.

Figure 33:
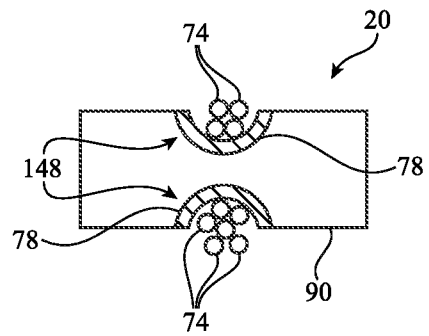
FIG. 33 is a side view of an illustrative electrical component having a wrapped fiber connection formed from fibers wrapped around the component in accordance with an embodiment.

In the illustrative arrangement of FIG. 33, one or more loops of fibers 74 are wrapped around body 90 against contact(s) 96, thereby forming a wrapped-fiber electrical connection between fiber(s) 74 and component 20.

If desired, additional types of connections may be used in coupling fibers 74 to components 20. The arrangements of FIGS. 26, 27, 28, 29, 30 31, 32, and 33 are merely illustrative.

The foregoing is merely illustrative and various modifications can be made by those skilled in the art without departing from the scope and spirit of the described embodiments. The foregoing embodiments may be implemented individually or in any combination.

What is claimed is:

1. A fabric-based item, comprising:
   a knit fabric formed from strands including first and second conductive strands; and
   an electrical component having first and second grooves, a first contact in the first groove, and a second contact in the second groove, wherein the first conductive strand is soldered to the first contact in the first groove and the second conductive strand is soldered to the second contact in the second groove, wherein the electrical component comprises metal traces coupled to the first and second contacts and a plastic package that encloses the metal traces, and wherein the first and second grooves are formed in the plastic package.

2. The fabric-based item defined in claim 1 wherein the first and second conductive strands each comprise a conductive coating on a non-conductive core.

3. The fabric-based item defined in claim 1 wherein the first and second conductive strands each comprise a locally stripped insulating coating.

4. The fabric-based item defined in claim 1 wherein the electrical component is selected from the group consisting of: a light-emitting diode and a sensor.

5. The fabric-based item defined in claim 1 wherein the knit fabric comprises a pocket and wherein the electrical component is received within the pocket.

6. The fabric-based item defined in claim 1 wherein the first and second grooves each have curved sidewalls.

7. The fabric-based item defined in claim 1 wherein the strands include insulating strands knit with the first and second conductive strands.

8. The fabric-based item defined in claim 1 wherein the electrical component comprises a touch sensor electrode that forms part of a touch sensor array in the knit fabric.

9. The fabric-based item defined in claim 1 wherein the electrical component comprises a light-emitting diode that forms part of a pixel array in the knit fabric.

10. A fabric-based item, comprising:

fabric comprising knitted strands, wherein the knitted strands include a conductive strand; and an electrical component having a metal trace, a package enclosing the metal trace, a recess in the package, and a contact in the recess that is coupled to the metal trace, wherein the conductive strand is electrically coupled to the contact in the recess, wherein the fabric comprises a pocket, and wherein the electrical component is knitted into and retained within the pocket.

11. The fabric-based item defined in claim 10 wherein the package comprises a plastic package and wherein the recess is formed in the plastic package.

12. The fabric-based item defined in claim 11 wherein the electrical component comprises a printed circuit substrate and wherein the plastic package at least partially encloses the printed circuit substrate.

13. The fabric-based item defined in claim 12 wherein the electrical component comprises a terminal and wherein the trace routes signals between the terminal and the contact.

14. A fabric-based item, comprising:

a fabric comprising insulating strands and conductive strands that are knitted together, wherein the fabric comprises a pocket; and an electrical component in the pocket, wherein the electrical component has a first groove extending in a first direction and a second groove extending in a second direction that is different from the first direction, wherein the first and second grooves each receive a given one of the conductive strands, and wherein the first groove is parallel to a first axis that extends along the first direction and the second groove is parallel to a second axis that extends along the second direction.

15. The fabric-based item defined in claim 14 further comprising a contact in the groove, wherein the given one of the conductive strands is soldered to the contact in the groove.

16. The fabric-based item defined in claim 14 wherein the electrical component is selected from the group consisting of: a light-emitting diode and a sensor.

17. The fabric-based item defined in claim 14 wherein the electrical component comprises a plastic package and wherein the first and second grooves are formed in the plastic package.

* * * * *